United States Patent
Huang et al.

(10) Patent No.: US 10,484,588 B2
(45) Date of Patent: Nov. 19, 2019

(54) CAMERA MODULE OF REDUCED SIZE

(71) Applicants: TRIPLE WIN TECHNOLOGY (SHENZHEN) CO. LTD., Shenzhen (CN); HON HAI PRECISION INDUSTRY CO., LTD., New Taipei (TW)

(72) Inventors: Ding-Nan Huang, New Taipei (TW); Kun Li, Guangdong (CN); Chien-Kun Wu, New Taipei (TW); Jing-Wei Li, Guangdong (CN)

(73) Assignee: TRIPLE WIN TECHNOLOGY(SHENZHEN) CO.LTD., Shenzhen (CN)

( * ) Notice: Subject to any disclaimer, the term of this patent is extended or adjusted under 35 U.S.C. 154(b) by 0 days.

(21) Appl. No.: 15/871,119

(22) Filed: Jan. 15, 2018

(65) Prior Publication Data
US 2019/0182412 A1   Jun. 13, 2019

(30) Foreign Application Priority Data
Dec. 7, 2017   (CN) .......................... 2017 2 1697614

(51) Int. Cl.
  *H04N 5/225*   (2006.01)
  *H05K 1/18*    (2006.01)
(52) U.S. Cl.
  CPC ......... *H04N 5/2257* (2013.01); *H04N 5/2252* (2013.01); *H04N 5/2253* (2013.01); *H04N 5/2254* (2013.01); *H05K 1/183* (2013.01); *H05K 2201/10151* (2013.01)

(58) Field of Classification Search
  CPC .... G03B 2205/0053–0084; G03B 7/10; G03B 13/36; H04N 5/23212; H04N 5/2356; H04N 5/2257; H04M 1/0264; H01L 27/14618; G02B 7/04–105; G02B 7/09; G02B 7/102; G02B 7/28–40; G02B 13/001–009
  See application file for complete search history.

(56) References Cited

U.S. PATENT DOCUMENTS

| 2012/0162790 | A1* | 6/2012 | Chiang | .................. G02B 7/08 359/824 |
| 2015/0281528 | A1* | 10/2015 | Li | ........................ H04N 5/2253 348/357 |
| 2017/0310860 | A1* | 10/2017 | Wang | .................. G02B 13/006 |

* cited by examiner

*Primary Examiner* — Sinh Tran
*Assistant Examiner* — Selam T Gebriel
(74) *Attorney, Agent, or Firm* — ScienBiziP, P.C.

(57) ABSTRACT

A reduced size of camera module includes a camera lens, an optical filter, a sensor, an optical filter trestle, and a module trestle. The camera lens lies on a light path of the camera module towards the sensor. The camera lens is mounted on the optical filter trestle. The optical filter is received is the optical filter trestle. The optical filter trestle is mounted on the module trestle. The sensor is received in the in the module trestle.

7 Claims, 4 Drawing Sheets

CAMERA MODULE OF REDUCED SIZE

FIELD

The subject matter generally relates to a camera module of reduced size.

BACKGROUND

In the traditional chip on board (COB) technology, a sensor can be mounted on a printed circuit board, and an optical filter and a motor are both mounted on a pedestal. The pedestal is plastic and is bonded on the printed circuit board. Some circuit elements, such as resistors, capacitors, etc are mounted on the printed circuit board. So, the camera module will have a larger volume, which goes against the miniaturization of the camera module. Further, because of the pedestal is made in one body, position and size of the sensor cannot be flexibly adjusted. Improvement in the art is preferred.

BRIEF DESCRIPTION OF THE DRAWINGS

Implementations of the present disclosure will now be described, by way of example only, with reference to the attached figures.

DETAILED DESCRIPTION OF EMBODIMENTS

Figure 1:
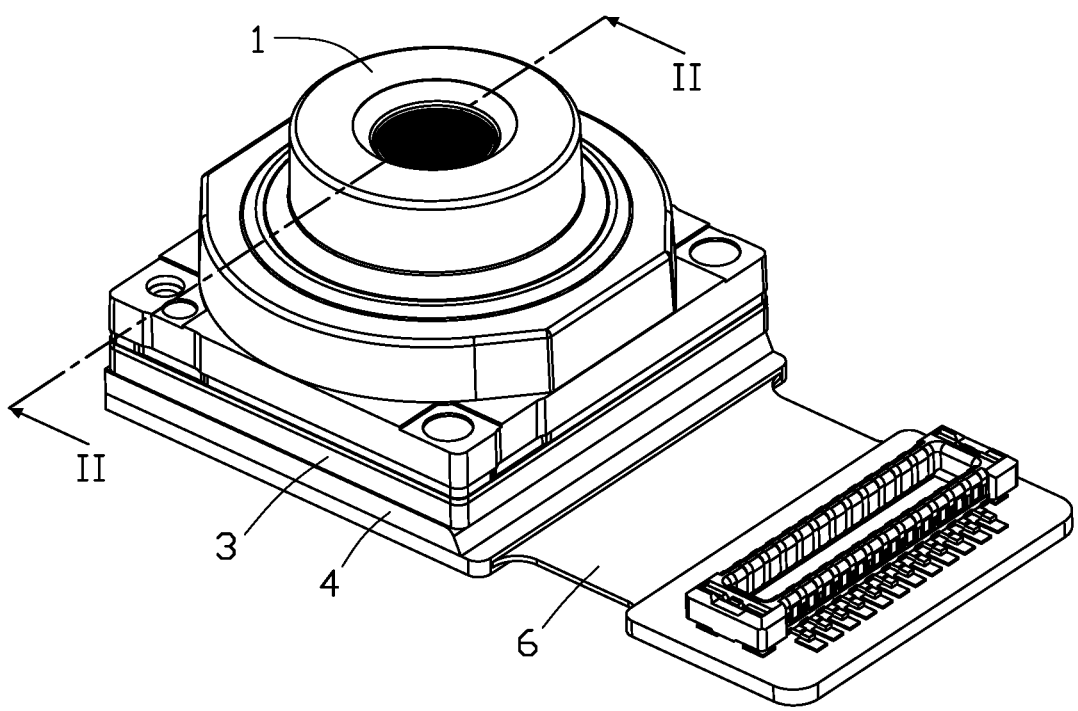
FIG. 1 is a cross-sectional view of an exemplary embodiment of a camera module of reduced size according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The disclosure is illustrated by way of example and not by way of limitation in the figures of the accompanying drawings. It should be noted that references to "an" or "one" embodiment in this disclosure are not necessarily to the same embodiment, and such references mean "at least one."

The term "comprising" when utilized, means "including, but not necessarily limited to"; it specifically indicates open-ended inclusion or membership in the so-described combination, group, series, and the like.

Figure 2:
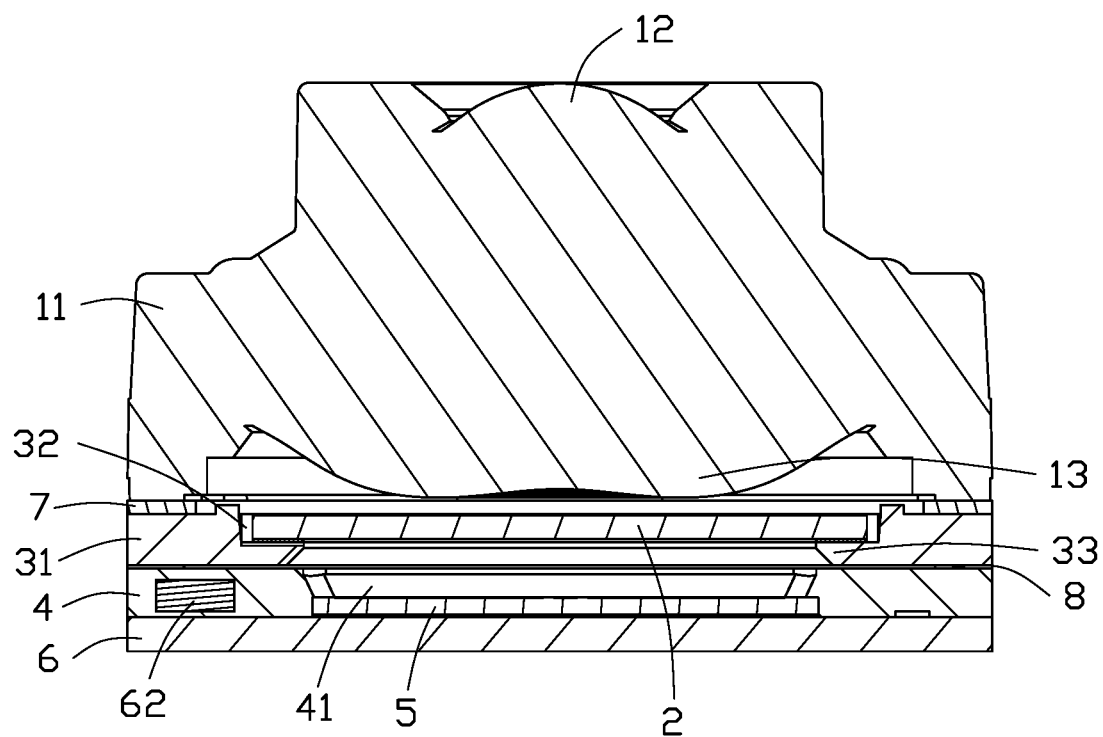
FIG. 2 is a cross-sectional view of the camera module of reduced size of FIG. 1 along line II-II of FIG. 1.
Figure 3:
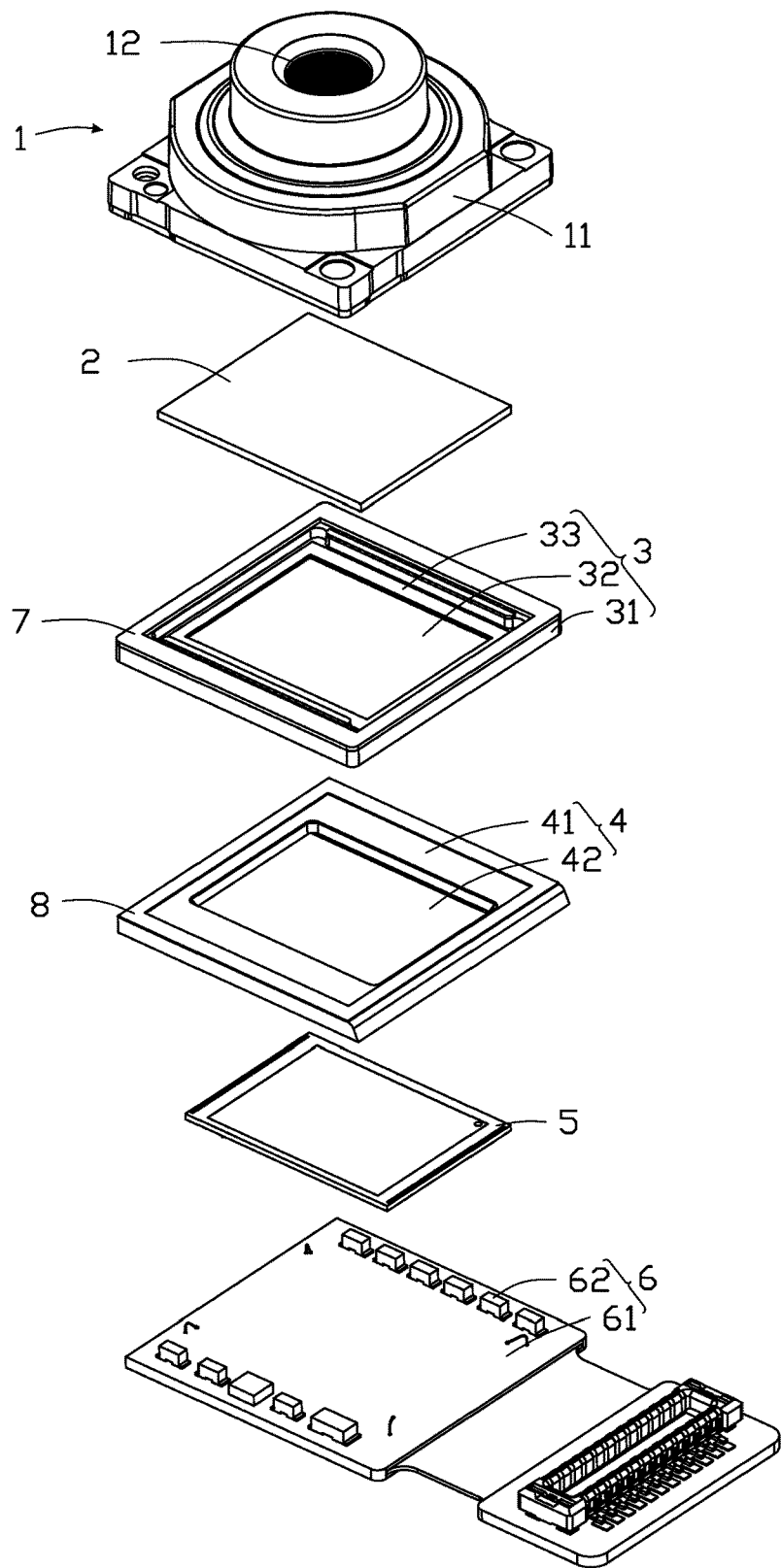
FIG. 3 is an exploded view of the camera module of reduced size of FIG. 1.

FIGS. 1-3 illustrate a first exemplary embodiment of a camera module of reduced size 100. The camera module of reduced size 100 includes a camera lens 1, an optical filter 2, an optical filter trestle 3, a module trestle 4, a sensor 5, and a printed circuit board 6.

The sensor 5 is mounted on the printed circuit board 6 and received in the module trestle 4. The module trestle 4 is mounted on the printed circuit board 6. The optical filter trestle 3 is mounted on the module trestle 4 by a second adhesive layer 8. The optical filter 2 is received is the optical filter trestle 3. The camera lens 1 is mounted on the optical filter trestle 3 by a first adhesive 7. The camera lens 1 lies on a light path of the camera module of reduced size 100 towards the sensor 5.

The camera lens 1 includes a lens cone 11, a first lens 12, and a second lens 13. The first lens 12 and the second lens 13 are received in the lens cone 11. The first lens 12 is formed on object side of the camera module of reduced size 100. The second lens 13 is formed on image side of the camera module of reduced size 100.

The optical filter 2 filters light entering into the camera module of reduced size 100 and stops stray light from entering into the camera module of reduced size 100, to form higher quality image.

The optical filter 2 is a filter selected from a group consisting of ultraviolet filter, visible filter, infrared filter, and infrared-cut filter. The optical filter 2 provided herein is not limited to the examples provided herein.

In at least one exemplary embodiment, the optical filter 2 is an infrared-cut filter.

In at least one exemplary embodiment, the optical filter 2 faces the second lens 13.

The optical filter trestle 3 supports and receives the optical filter 2. The optical filter trestle 3 includes an optical filter trestle body 31. The optical filter trestle body 31 includes a first receiving groove 32 and a first supporting portion 33 perpendicularly extending from an inner surface of the first receiving groove 32. The first receiving groove 32 passes through the optical filter trestle body 31. The first supporting portion 33 is hollow. A surface of the first supporting portion 33 facing the second lens 13 is lower than a surface of the optical filter trestle body 31 facing the second lens 13.

The optical filter 2 is received in the first receiving groove 32 and mounted on the first supporting portion 33.

The module trestle 4 receives the sensor 5 and partly encloses the printed circuit board 6.

The module trestle 4 includes a hollow module trestle body 41. The hollow module trestle body 41 includes a second receiving groove 42. The second receiving groove 4 is perpendicularly sunken from a surface of the module trestle body 41 to the module trestle body 41.

The optical filter trestle body 31 is mounted on the module trestle body 41 by the second adhesive layer 8.

The sensor 5 is received in the second receiving groove 42.

The sensor 5 can be selected from a charge coupled device (CCD) or a complementary metal-oxide semiconductor (CMOS).

In at least one exemplary embodiment, the sensor 5 is a CCD.

The printed circuit board 6 includes a mounting surface 61. The sensor 5 is mounted on the mounting surface 61 and electrically connected to the printed circuit board 6. The module trestle body 41 is mounted on the mounting surface 61.

The printed circuit board 6 further includes a plurality of electric components 62. The plurality of electric components 62 is mounted on the mounting surface 61 and electrically connected to the printed circuit board 6.

The sensor 5 and the plurality of electric components 62 are both received in the second receiving groove 42.

The plurality of electric components 62 are selected from a group consisting of resistors, capacitors, drive chip, reproducible read-only memory devices, and a combination thereof.

Figure 4:
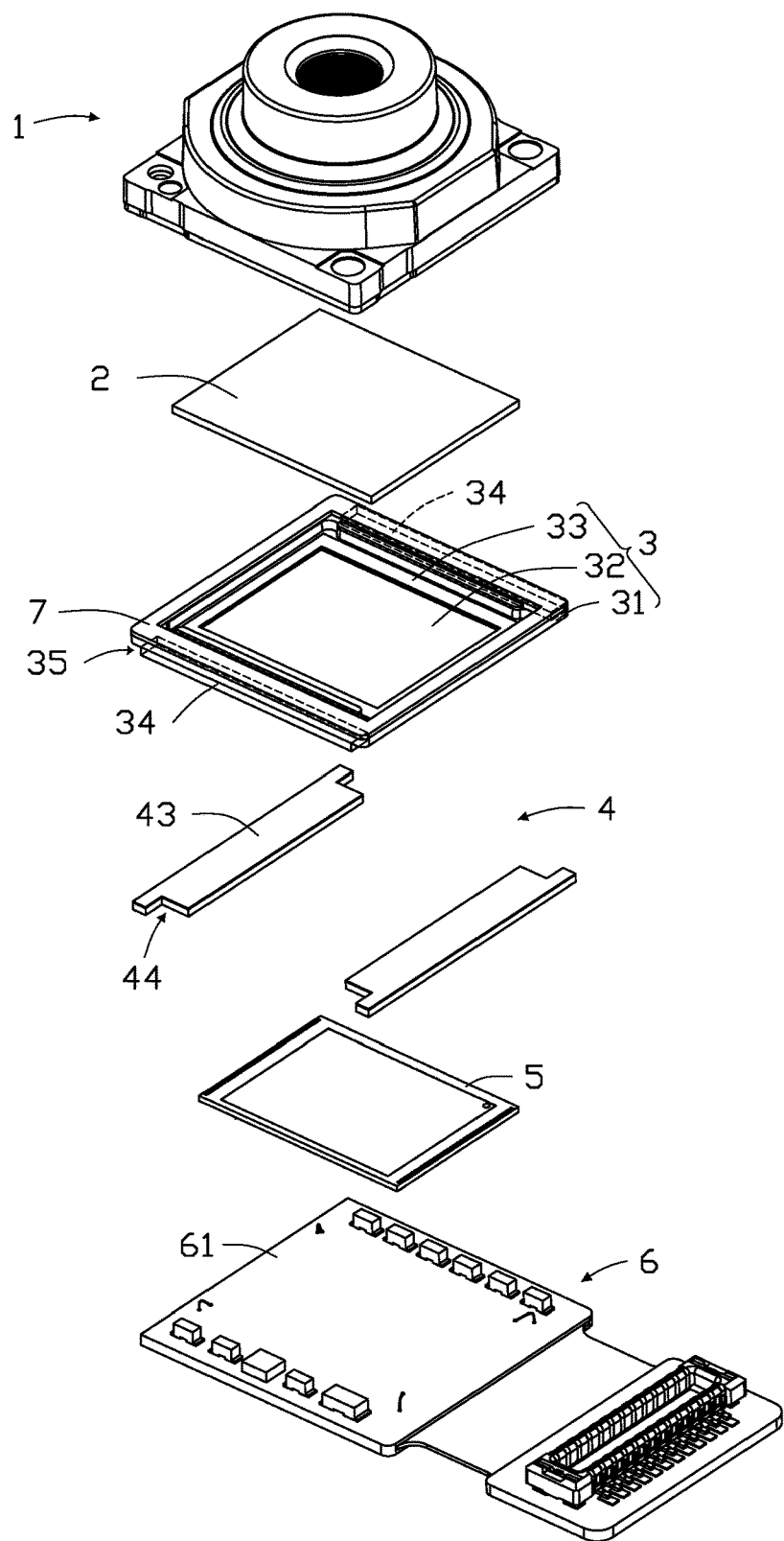
FIG. 4 is another exemplary embodiment of a camera module of reduced size different from the camera module of FIG. 1.

FIG. 4 illustrates a second exemplary embodiment of a camera module of reduced size 200. The camera module of reduced size 200 has substantially the same structure as the camera module of reduced size 100. Differences between the camera module of reduced size 200 and the camera module of reduced size 100 are that the optical filter trestle 3 further includes two first plates 34, the two first plates 34 is perpendicularly extending from an outer edge of the optical filter trestle body 31. The two first plates 34 face with each other. Each of the first plates 34 has two first grooves 35, the two first grooves 35 are formed in ends of each of the first plates 34. The module trestle 4 includes two second plates 43. The two second plates 43 are perpendicular to the two first plates 34. The two second plates 43 face with each other. Each of the second plates 43 has two second grooves 44, the two second grooves 44 are formed in ends of each of the second plates 43. The two first plates 34 and the two second plates 43 are connected end to end. The two first grooves 35 are connected to the two second grooves 44 respectively. The two first plates 34 and the two second plates 43 are mounted on the mounting surface 61 of the printed circuit board 6.

With the above configuration, the camera module of reduced size 100, 200 uses the optical filter trestle 3 and the module trestle 4 to bear the optical filter 2, the sensor 5, and the printed circuit board 6.

Thereby, thickness of the camera module of reduced size 100, 200 can be reduced, developments towards miniaturization can be achieved, and different designs of the optical filter trestle 3 and the module trestle 4 are then allowed to increase flexibility of a structure of the camera module of reduced size 100, 200 for better positioning and sizes of the optical filter 2 and the sensor 5.

It is to be understood, even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A camera module of reduced size, comprising:
   a camera lens;
   an optical filter;
   a sensor, wherein the camera lens lies on a light path of the camera module of reduced size towards the sensor;
   an optical filter trestle;
   wherein the camera lens is mounted on the optical filter trestle, the optical filter is received in the optical filter trestle;
   the optical filter trestle comprises an optical filter trestle body and two first plates perpendicularly extending from an outer edge of the optical filter trestle body, the two first plates face each other; and
   a module trestle, wherein the module trestle comprises two second plates, the two second plates face each other and are perpendicular to the two first plates, the two first plates and the two second plates are connected end to end, each of the two first plates has two first grooves, the two first grooves are formed in ends of each of the two first plates, each of the two second plates has two second grooves, the two second grooves are formed in ends of each of two the second plates, each of the two first grooves is connected to one second groove, the sensor is received in the module trestle.

2. The camera module of reduced size of claim 1, wherein the optical filter trestle body comprises a first receiving groove and a first supporting portion perpendicularly extending from an inner surface of the first receiving groove, the optical filter is received in the first receiving groove and mounted on the first supporting portion.

3. The camera module of reduced size of claim 2, wherein the first receiving groove passes through the optical filter trestle body.

4. The camera module of reduced size of claim 2, wherein the camera lens comprises a second lens, the second lens is formed on image side of the camera module of reduced size, a surface of the first supporting portion facing the second lens is lower than a surface of the optical filter trestle body facing the second lens.

5. The camera module of reduced size of claim 1, wherein the camera module of reduced size further comprises a printed circuit board, the sensor is mounted on the printed circuit board, the two first plates and the two second plates are mounted on the printed circuit board.

6. The camera module of reduced size of claim 5, wherein the printed circuit board further comprises electrical components, each of the electrical components is mounted on the printed circuit board and electrically connected to the printed circuit board.

7. The camera module of reduced size of claim 6, wherein the two first plates and the two second plates define a second receiving groove, the electrical components are received in the second receiving groove.

* * * * *